United States Patent
Rajai et al.

(10) Patent No.: US 11,316,707 B2
(45) Date of Patent: Apr. 26, 2022

(54) LOW POWER METHODS FOR SIGNAL PROCESSING BLOCKS IN ETHERNET PHY

(71) Applicant: TEXAS INSTRUMENTS INCORPORATED, Dallas, TX (US)

(72) Inventors: Kalpesh Laxmanbhai Rajai, Bangalore (IN); Saravanakkumar Radhakrishnan, Aruppukottai (IN); Gaurav Aggarwal, New Delhi (IN); Raghu Ganesan, Bangalore (IN); Rallabandi V Lakshmi Annapurna, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/199,142

(22) Filed: Mar. 11, 2021

(65) Prior Publication Data

US 2021/0288826 A1 Sep. 16, 2021

(30) Foreign Application Priority Data

Mar. 13, 2020 (IN) .............................. 202041010814

(51) Int. Cl.
 *H04L 25/03* (2006.01)
 *H04L 12/12* (2006.01)
 *H03H 17/06* (2006.01)

(52) U.S. Cl.
 CPC ............. *H04L 12/12* (2013.01); *H03H 17/06* (2013.01); *H04L 25/03057* (2013.01)

(58) Field of Classification Search
 CPC ..... H04L 25/03038; H04L 2025/03617; H04L 27/01; H04L 25/03025; H04L 25/03057; H03H 17/06

USPC .................................. 375/229, 232–233, 350
See application file for complete search history.

(56) References Cited

U.S. PATENT DOCUMENTS

| | | | |
|---|---|---|---|
| 7,339,988 B1* | 3/2008 | Shanbhag | H04L 25/03044 375/232 |
| 10,203,809 B2 | 2/2019 | Sobel et al. | |
| 10,536,155 B1 | 1/2020 | Otte | |
| 2003/0072059 A1* | 4/2003 | Thomas | H04J 14/028 398/167.5 |
| 2003/0099208 A1 | 5/2003 | Graziano et al. | |

(Continued)

FOREIGN PATENT DOCUMENTS

| | | |
|---|---|---|
| EP | 0929945 | 12/2005 |
| EP | 2806570 | 11/2014 |

OTHER PUBLICATIONS

International Search Report in corresponding PCT Application No. PCT/US2021/022349, dated May 27, 2021 (2 pages).

(Continued)

*Primary Examiner* — Emmanuel Bayard
(74) *Attorney, Agent, or Firm* — John R. Pessetto; Charles A. Brill; Frank D Cimino

(57) ABSTRACT

A method includes receiving an input signal at a filter, where the filter includes a plurality of filter taps, and where each of a first filter tap and a second filter tap has a weighting coefficient. The method also includes shutting down the first filter tap based on the weighting coefficient of the first filter tap being below a threshold and the weighting coefficient of the second filter tap being below the threshold, where the second filter tap is next to the first filter tap.

12 Claims, 9 Drawing Sheets

(56) References Cited

U.S. PATENT DOCUMENTS

| | | |
|---|---|---|
| 2009/0135035 A1 | 5/2009 | Fifield |
| 2009/0207925 A1 | 8/2009 | Liu |
| 2010/0309963 A1 | 12/2010 | Agazzi et al. |
| 2013/0336378 A1* | 12/2013 | Agrawal ............... H03K 5/135 375/233 |
| 2014/0064352 A1* | 3/2014 | Zhong ............... H04L 25/03038 375/233 |
| 2014/0266823 A1 | 9/2014 | Biallais et al. |
| 2014/0348276 A1* | 11/2014 | Pandey ................... H04B 3/23 375/350 |
| 2016/0308627 A1 | 10/2016 | Park et al. |
| 2017/0070952 A1 | 3/2017 | Balakrishnan et al. |
| 2019/0173480 A1 | 6/2019 | Ryu et al. |
| 2020/0092053 A1* | 3/2020 | Bai ...................... H04B 17/101 |
| 2021/0218604 A1* | 7/2021 | Wu ................... H04L 25/03146 |

OTHER PUBLICATIONS

International Search Report in corresponding PCT Application No. PCT/US2021/022344, dated Jun. 17, 2021 (2 pages).
International Search Report in corresponding PCT Application No. PCT/US2021/022351, dated Jun. 24, 2021 (4 pages).

* cited by examiner

|  |  | BLIND SHUTDOWN | | NEIGHBOR METHOD | |
| --- | --- | --- | --- | --- | --- |
| CABLE LENGTH | THRESHOLD | TAPS | SNR (dB) | TAPS | SNR (dB) |
| 6m | - | 216 | 25.1dB | 216 | 25.1dB |
| 6m | 1 | 20 | 24.9dB | 26 | 24.8dB |
| 6m | 2 | 12 | 22.9dB | 14 | 24.5dB |
| 15m | - | 216 | 22.9dB | 216 | 22.9dB |
| 15m | 1 | 40 | 22.3dB | 50 | 22.8dB |
| 15m | 2 | 20 | 20.1dB | 26 | 22.1dB |

LOW POWER METHODS FOR SIGNAL PROCESSING BLOCKS IN ETHERNET PHY

CROSS-REFERENCE TO RELATED APPLICATIONS

The present application claims priority to Indian Provisional Patent Application No. 202041010814, which was filed Mar. 13, 2020, is titled "Novel Low Power Methods For Signal Processing Blocks In Ethernet PHY," and is hereby incorporated herein by reference in its entirety.

The present application relates to the commonly-assigned, co-pending application titled "Interleaving ADC Error Correction Methods For Ethernet PHY," which has Ser. No. 17/200,426, a filing date of Mar. 12, 2021, and which claims priority to Indian Provisional Patent Application No. 202041024507, which has a filing date of Mar. 13, 2020 and is titled "Interleaving ADC Error Correction Methods for Ethernet PHY." Both applications are hereby incorporated herein by reference in their entireties.

BACKGROUND

Ethernet is a network protocol that controls how data is transmitted over a local area network (LAN). Gigabit Ethernet transmits Ethernet frames at a rate of one gigabit per second. Data is transmitted over shielded or unshielded twisted pair cables. An Ethernet receiver receives data from a transmitter. The receiver includes an analog front end followed by a digital processing section.

SUMMARY

In accordance with at least one example of the description, a system includes a filter configured to receive an input signal, the filter having a first tap, a second tap, and a third tap, and each first tap, second tap, and third tap having a weighting coefficient and a data gate. The data gate is configured to shut down the first filter tap responsive to the weighting coefficients of the first filter tap, the second filter tap, and the third filter tap each being below a threshold, and where the second filter tap and the third filter tap are each next to the first filter tap.

In accordance with at least one example of the description, a method includes receiving an input signal at a filter, where the filter includes a plurality of filter taps, and where each of a first filter tap and a second filter tap has a weighting coefficient. The method also includes shutting down the first filter tap based on the weighting coefficient of the first filter tap being below a threshold and the weighting coefficient of the second filter tap being below the threshold, where the second filter tap is next to the first filter tap.

In accordance with at least one example of the description, a method includes determining a mean square error (MSE) for a signal in an Ethernet receiver. The method includes comparing the MSE to a target MSE. The method also includes changing a threshold for shutting down a filter tap responsive to the MSE being above or below the target MSE and an error value. The method includes setting the threshold for shutting down the filter tap responsive to the MSE being above the target MSE minus the error value or below the target MSE plus the error value.

DETAILED DESCRIPTION

Some Ethernet applications, such as automotive applications, are employed in situations where low power consumption is useful. High speed Ethernet implementations may consume large amounts of power. One conventional technique for reducing power is to share the hardware used for filter taps within an echo canceller in the digital section of the receiver. Another conventional technique for reducing power is to shut down certain filter taps if those filter tap values are below a threshold. However, these conventional techniques may not reduce power consumption to a more useful level, and may cause performance to fall below an acceptable threshold.

In examples herein, certain filter taps in an Ethernet receiver may be shut down to reduce power consumption. Unwanted filter taps are distinguished from wanted filter taps, and the unwanted filter taps may be shut down. Rather than using an absolute threshold to shut down a filter tap, a filter tap may be shut down if the filter tap and a certain number of neighboring filter taps each have filter tap coefficients that are lower than a predetermined threshold. In an example, the predetermined shutdown threshold may be tuned based on a target signal to noise ratio (SNR). The target SNR may be based on the Ethernet channel length in another example. With the use of some or all of these techniques, power consumption may be reduced while still maintaining acceptable performance of the system.

Figure 1:
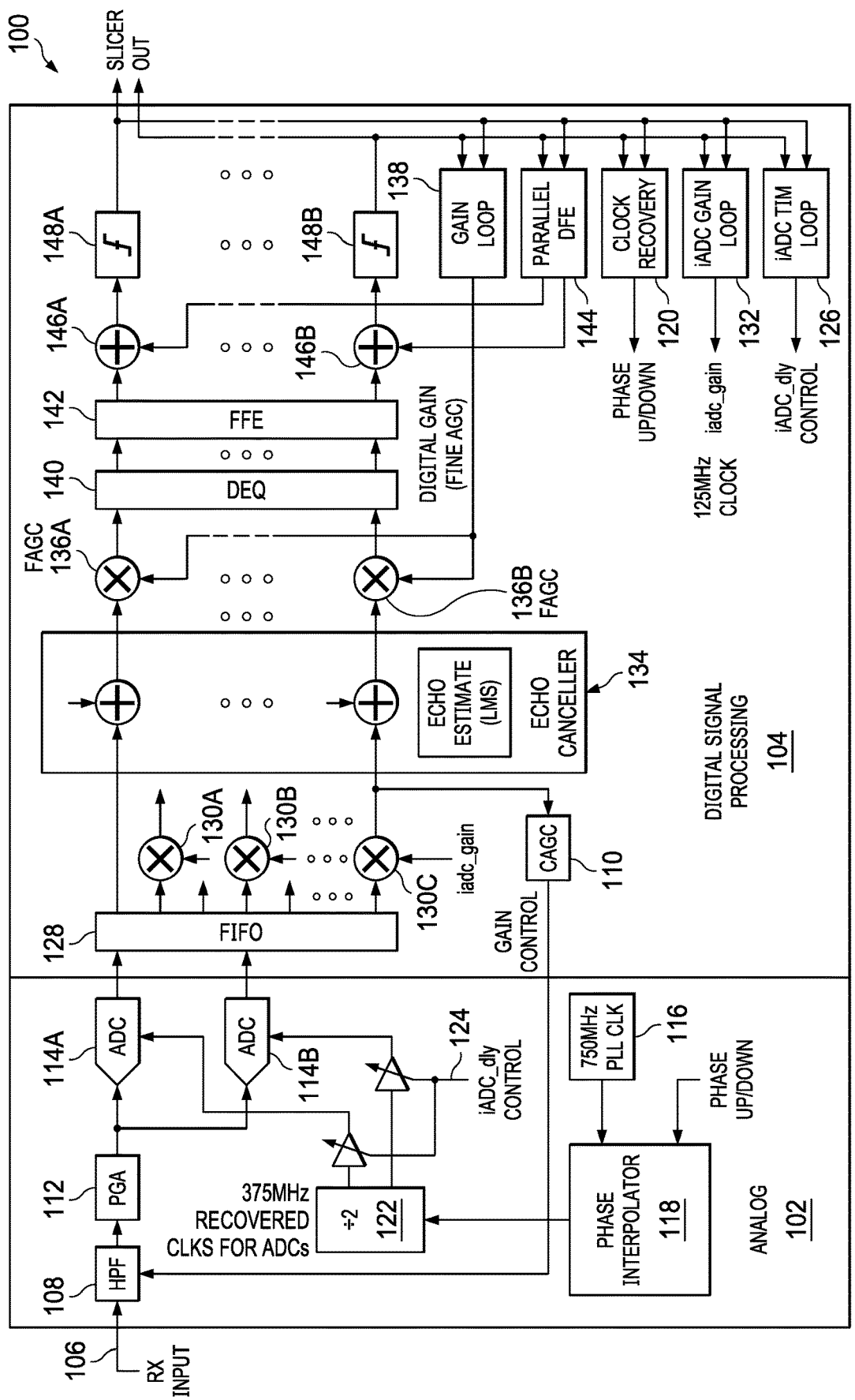
FIG. 1 is a block diagram of a receiver in an Ethernet system in accordance with various examples.

Receiver 100 (shown in FIG. 1) may be implemented in an Ethernet system in accordance with various examples herein. FIG. 1 illustrates the Ethernet physical (PHY) layer receive path. The transmitter path is not shown in FIG. 1. Receiver 100 includes an analog front end 102 and a digital signal processing section 104. In operation, an input signal is received at receiver input 106 via a network conductor (such as a local area network cable, an Ethernet cable or some other network connection or bus). The input signal passes through high pass filter 108 (e.g. an analog high pass filter). A coarse automatic gain control (CAGC) 110 provides gain to the input signal, so the amplitude of the input signal is at an appropriate level for other components in receiver 100. In addition, an appropriate gain (with little or no added noise) will increase the signal-to-noise ratio of the input signal. In another example embodiment, HPF 108 may include a low-noise amplifier (not shown) and a high-pass filter. CAGC 110 is in digital signal processing section 104 in this example.

High pass filter 108 provides the filtered input signal to programmable gain amplifier (PGA) 112. PGA 112 provides additional amplification to the input signal. The input signal is then provided to an analog to digital converter (ADC) block, which includes ADC 114A and ADC 114B in this example (collectively, ADCs 114). In one example, receiver 100 has a symbol rate of 750 megahertz (MHz). ADCs 114A and 114B are interleaved, so each ADC 114 operates at 375 MHz to provide a total throughput of 750 MHz. The clock signal in this example is provided by a 750 MHz phase locked loop (PLL) 116. The clock signal passes through a phase interpolator 118, which may lag or lead the clock signal during operation. Phase interpolator 118 has a 6-bit control in one example, which means it may adjust the phase of the clock signal by $2^6=64$ different values. A clock recovery loop 120 in digital signal processing section 104 sends a phase up/down signal to control phase interpolator 118.

The clock output from phase interpolator 118 is divided into 375 MHz recovered clock signals at clock divisor 122. The 375 MHz clock signals are provided to ADCs 114. A timing recovery loop that includes incremental ADC (iADC) delay control 124 and iADC timing loop 126 (in digital signal processing section 104) provide timing recovery functions for ADCs 114A and 114B.

Output signals from ADCs 114A and 114B are provided to FIFO (first in first out) 128 in digital signal processing section 104. FIFO 128 receives the signals from ADCs 114A and 114B and provides multiple paths (for purposes of this description, six paths) at its output. Only a subset of the six paths is shown here. Each of the six paths operates at 125 MHz (e.g. determined by 750 MHz divided by the number of paths, which is six in this example), which provides a total operating speed of 750 MHz. Each of the six paths includes a gain component 130 (collectively, gain components 130). Only three gain components 130A, 130B, and 130C are shown for simplicity. The gain of the gain components 130 may be adjusted with an iADC gain control signal provided by iADC gain loop 132. The output signals of the gain components 130 are provided to an echo canceller 134.

Echo refers to interference between transmitted and received data on a channel. Echo may be generated if a near-end transmitted signal is reflected from a transmit path onto a receive path. Echo may also be generated if at least a portion of a transmitted signal on an individual pair of twisted wire(s) is reflected back from a target device. Echo canceller 134 provides echo cancellation and is described in examples below. In some examples, echo cancellation may be performed in analog front end 102 as well (not shown in FIG. 1). Echo canceller 134 generates an echo estimate and attempts to cancel the echo by subtracting the echo estimate from the signal. An adaptive filter, such as a finite impulse response filter, may be used to model the response of the echo path.

After echo canceller 134 provides echo cancellation, echo canceller 134 provides signals on six paths. In this example, six paths are used, but in other examples there may be a different number of paths, or only one path. The six signals are provided to a fine automatic gain control (FAGC) component 136. Two FAGCs 136A and 136B (collectively, FAGCs 136) are shown for simplicity, rather than all six used in this example. FAGCs 136 provide fine gain control to the signals in conjunction with gain loop 138. The six signals are then provided to digital equalizer (DEQ) 140. DEQ 140 provides equalization to the signals, which are then provided to feed forward equalizer (FFE) 142, which also provides equalization to the signals. FFE 142 may use delay components to provide weighted signals that are fed forward and summed to provide equalization in one example.

At the output of FFE 142, a parallel decision feedback equalizer (DFE) 144 receives the output signals and stores symbols in a shift register within DFE 144. DFE 144 uses a feedback loop with adders 146A and 146B (collectively, adders 146; only two adders 146 are shown for simplicity) to remove intersymbol interference (ISI) from the output signals. ISI occurs if one symbol interferes with another symbol. After DFE 144 removes ISI, symbols are sampled by slicers 148A and 148B (collectively, slicers 148; two slicers 148 are shown, although there may be more slicers 148 in other examples), and then the symbols are provided to the next processing block of the Ethernet implementation.

A substantial portion of the current in receiver 100 is consumed by echo canceller 134, FFE 142, and DFE 144. Reducing current in these components may help to reduce the overall current consumed by receiver 100. In one example, digital signal processing section 104 consumes approximately 250 milliamps (mA) of current. DFE 144 consumes approximately 80 mA, echo canceller 134 consumes approximately 60 mA, and FFE 142 consumes approximately 10 mA. In this example, each of these components includes a filter that has a plurality of filter taps. DFE 144 has 42 filter taps, echo canceller 134 has 216 filter taps, and FFE 142 has 4 filter taps. In other examples, these components may have different numbers of filter taps. By shutting down filter taps if neighboring filter taps are below a certain threshold according to examples described below, current consumption may be reduced in receiver 100. In an example herein, DFE 144, echo canceller 134, and/or FFE 142 are configured to shut down filter taps responsive to neighboring filter taps being below a certain threshold, thereby reducing power consumption. These techniques are now described with respect to FIG. 2.

Figure 2:
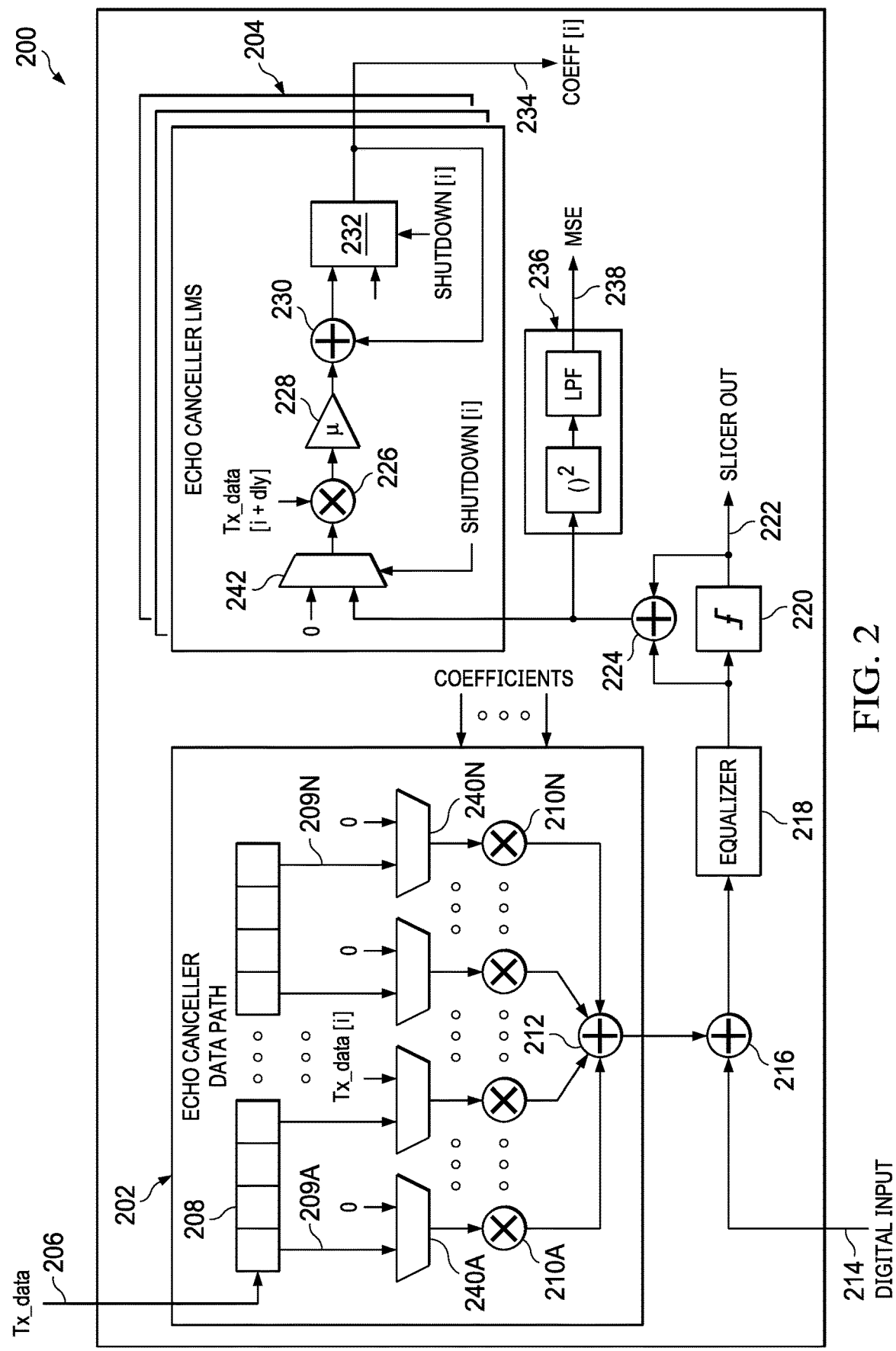
FIG. 2 is a block diagram of an echo canceller in accordance with various examples.

FIG. 2 is an echo canceller 200 in accordance with various examples. Echo canceller 200 is an example implementation of echo canceller 134 from FIG. 1. In other examples, echo canceller 200 may include other components not illustrated in FIG. 2. Echo canceller 200 includes a data path 202 and a least mean square (LMS) block 204. Transmit data 206 enters a shift register 208 in echo canceller 200. Transmit data 206 is a transmit signal that interferes with signals on the receive side (such as receiver 100). In one example, transmit data 206 represents the originally transmitted signal that reappears, with some delay, in the received signal (e.g., an echo). Once the echo is recognized, it may be removed by subtracting it from the received signal. A digital signal processor, analog circuitry, or software (not shown in FIG. 2) may recognize the echo signal and convert it to a digital signal, such as transmit data 206. Echo canceller 200 is configured to cancel this interfering transmit data 206. Transmit data 206 is received in the form of symbols 0, 1, or −1 in this example, which are saved in shift register 208. In this example, shift register 208 has 216 filter taps 209, which makes this a 216-tap filter. Four filter taps 209A to 209N are shown in FIG. 2 for simplicity. The output of each filter tap 209 is multiplied by a weighting coefficient (referred to hereinafter as coefficients) using multipliers 210A to 210N (collectively, multipliers 210). The products of multipliers 210 are summed by adder 212. A digital input signal 214 is added to the output of adder 212 with adder 216. Digital inputs signal 214 is an input signal from an ADC such as ADC 114 (FIG. 1). Digital input signal 214 includes the unwanted echo signal. Digital input signal 214 and adder 216 may operate to cancel the recovered echo signal. The output of adder 216 is provided to equalizer 218, which equalizes the signal. The output of equalizer 218 is provided to slicer 220, which produces a slicer output 222.

Coefficients for the echo canceller 200 are found on the right side of echo canceller 200 using LMS block 204. Slicer error for slicer 220 is found with adder 224. The slicer error is provided to LMS block 204. The slicer error is multiplied by the transmit data 206 from the filter tap 209 on the shift register 208 for a given filter tap i 209 by using multiplier 226. The result of multiplier 226 is scaled down with amplifier 228 and accumulated with adder 230. The result of the accumulation is stored in register 232. Register 232 contains the echo canceller coefficient, which is estimated during training. Over time, a coefficient 234 is produced by LMS block 204 for a given filter tap i 209.

In an example, 216 LMS blocks 204 are used to determine the 216 coefficients. To reduce power consumption, an LMS sharing technique is useful. Rather than 216 separate LMS blocks 204, some of the hardware may be shared with more than one coefficient in a time multiplexed manner. That is, on a first clock cycle, a first coefficient is updated using a first LMS block 204. On a second clock cycle, the same first LMS block 204 updates a second coefficient. The same first LMS block 204 is used on a third clock cycle to update a third coefficient, and used again on a fourth clock cycle to update a fourth coefficient. Therefore, each LMS block 204 may be used four times, which is a technique known as 4× LMS sharing. With this technique, only 54 LMS blocks 204 are used rather than 216 LMS blocks 204. In another example, each LMS block 204 is used twice, which is called 2× LMS sharing. 4× LMS sharing may save approximately 20 mA current consumption in some examples.

Echo canceller 200 may also produce a mean square error (MSE). The output of adder 224 in echo canceller 200 is the slicer 220 error, and provides an example of noise in the system. MSE may be calculated from this noise. The output of adder 224 is provided to MSE block 236, which squares the error and then passes the output signal through a low pass filter. The output of the low pass filter is the MSE 238. MSE 238 is a measure of the performance of receiver 100, and may be used to tune a threshold for shutting down taps 209 as described in examples below.

Multiple techniques are useful in various examples to shut down filter taps 209 to reduce current consumption. In one example, the data in the data path 202 may be zeroed out as shown with the zeros coupled to taps 209. An AND gate such as data gates 240A to 240N may be used to zero out the filter taps 209 that are shut down to reduce current consumption. This technique is called data gating. With data gating, a zero is passed to multipliers 210A to 210N for filter taps 209 that are data gated, which produces an output of zero from multipliers 210A to 210N. Those filter taps 209 are therefore shut down via data gating.

Data gating may also be used in LMS block 204 rather than data path 202. The output signal from adder 224 may be zeroed with a data gate 242 for a specific filter tap 209 that is to be shut down. Zeroing out the data in LMS block 204 produces a zero coefficient 234, which shuts down the filter tap 209.

In another example, clock gating may be used to shut down a filter tap 209. A clock signal in LMS block 204 provided to register 232 may be shut down, which causes the coefficient output from LMS block 204 to be zero. The filter taps 209 that are to be shut down may therefore be shut down using clock gating or data gating.

Figure 3:
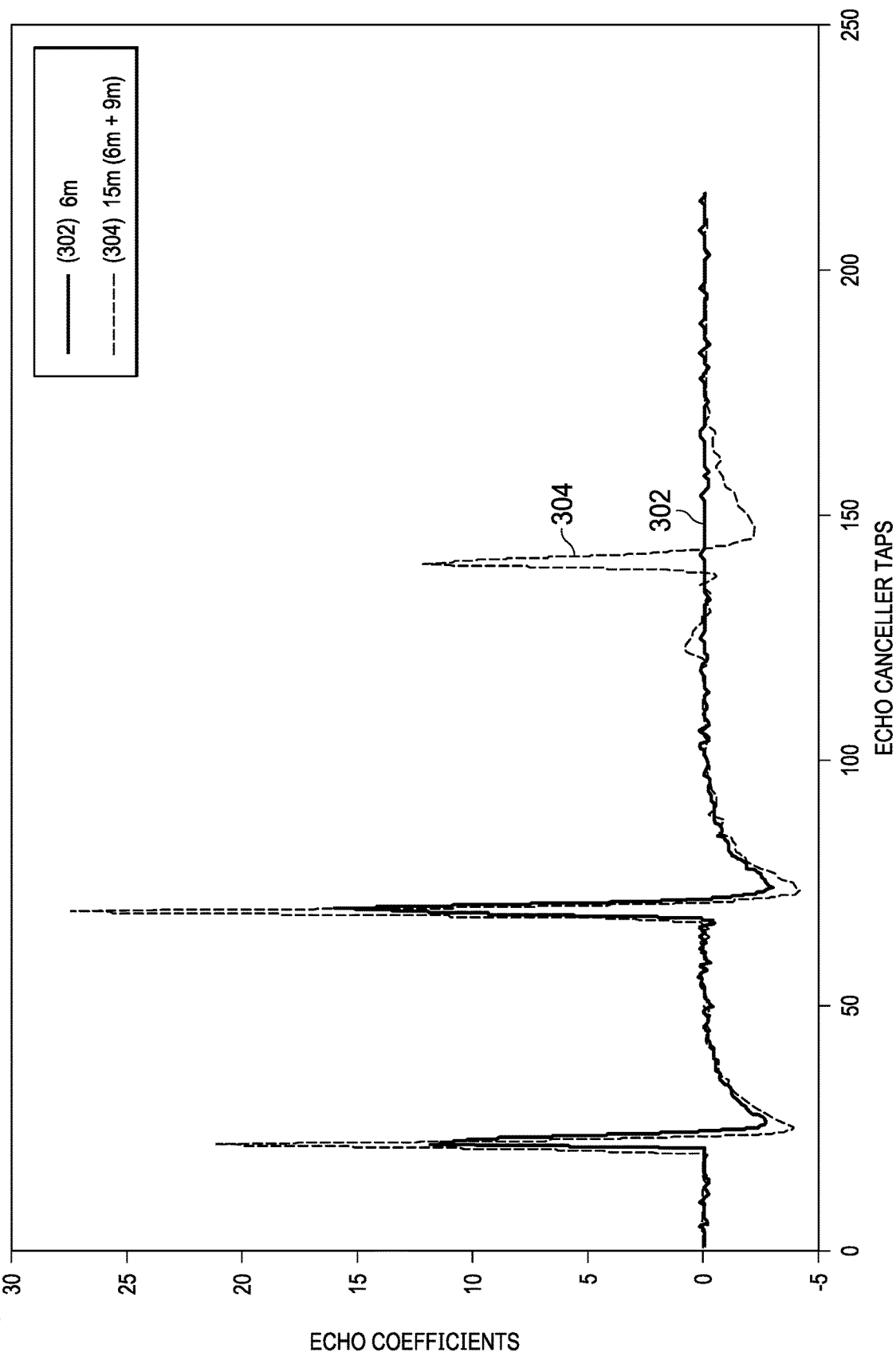
FIG. 3 is a graph of echo coefficients for 216 echo canceller taps in accordance with various examples.

FIG. 3 is a graph 300 of echo coefficients for 216 echo canceller filter taps in accordance with various examples. The x-axis indicates the number of the filter tap in the echo canceller, such as echo canceller 134. The y-axis indicates the value of the echo coefficient. A first curve 302 is a graph of a 6-meter Ethernet cable that has two peaks. A first peak of curve 302 is near filter tap 20, while a second peak is near filter tap 70. A second curve 304 is a graph of a 15-meter Ethernet cable, which in this example is composed of a 6-meter cable combined with a 9-meter cable. Curve 304 has three peaks, a first peak near filter tap 20, a second peak near filter tap 70, and a third peak near filter tap 140. The peaks in curves 302 and 304 are the peaks of the echo signal that the echo canceller 134 is configured to cancel. Therefore, in examples herein, filter taps that are near the peaks are kept on so the echo signal may be filtered and removed. Filter taps that are not near the peaks are shut down to reduce current consumption.

The first peaks in curves 302 and 304 represent the near end echo. Near end echo is the echo at the receiver from the near end transmitted signal. The near end echo occurs near filter tap 20 in this example. The second peaks in curves 302 and 304 represent the far end echo. Far end echo is the echo at the receiver from the signal transmitted at the far end. The far end echo occurs near filter tap 70 in this example. The far end echo is delayed behind the near end echo, so it occurs at a later filter tap number. The third peak occurs only in curve 304. Curve 304 is a graph of a 15-meter Ethernet cable, composed of a 6-meter cable combined with a 9-meter cable. The third peak occurs due to reflections from the connection in the middle of the combined 15-meter cable.

As seen in graph 300, there are 216 filter taps, but only a small portion of the coefficients are significant. That is, many of the coefficient values (on the y-axis) are zero or near zero as shown in graph 300. Therefore, dynamic shutdown of the insignificant filter taps may be performed to save power. For example, filter taps with a coefficient value greater than 1 or less than −1 may be considered significant. In conventional systems, after the coefficients of the filter taps are found, a blind threshold is applied (such as ±1.0). For coefficients that are lower than the threshold, the filter taps associated with those coefficients are shut down in the conventional system. One way to shut down a filter tap is for the clock or data for the filter tap to be gated as described above, and then the values of those filter taps become zero. Therefore, only the significant filter taps are left on. The conventional shut down technique may be performed in both echo canceller 134 and DFE 144. However, a limitation of the conventional solution is that if filter taps are shut down using a blind threshold, the system suffers reduced performance. Reduced performance occurs because some coefficients that are significant are nevertheless shut down, as those coefficients are below the threshold (e.g., between 1 and −1). A blind threshold, such as the threshold found in conventional systems, leads to reduced performance. If filter taps with significant coefficients are shut down, some portion of the echo may not be cancelled.

In examples herein, the decision to shut down a filter tap is determined by analyzing not only the filter tap under consideration but also the neighboring (e.g., adjacent) filter taps. As shown in FIG. 2, filter taps 209 receive output data from shift register 208. In one example, the filter taps are arranged sequentially (209A, 209B, 209C, . . . 209N) in a row, and receive output data from shift register 208 based on their position in the row. Neighboring filter taps, adjacent filter taps, or filter taps next to one another are filter taps that are consecutive in the row. For example, filter tap 209A is neighboring or adjacent to filter tap 209B. Filter tap 209B is neighboring or adjacent to both filter tap 209A and filter tap 209C. Filter tap 209C is neighboring or adjacent to both filter tap 209B and filter tap 209D. Filter taps that are within two neighbors of filter tap 209C are filter taps 209A and 209B on one side, and filter taps 209D and 209E on the other side. If the echo coefficient of a neighboring filter tap is above a threshold, the filter tap under consideration is kept on. Similarly, if all of a predetermined number of neighboring filter taps are below a threshold, the filter tap is shut down. For example, the nth filter tap is shut down if neighboring filter taps (n+k to n−k) are below the threshold. The value of k may be determined experimentally. With this technique, filter taps near the peak coefficient values are not shut down, and only unwanted filter taps are shut down.

In one example, the value of k is 2, and filter tap 50 is the filter tap under consideration. If the coefficient value of filter tap 50 is above the threshold, filter tap 50 remains on. However, if the coefficient value of filter tap 50 is below the threshold, the neighboring filter taps are considered to determine whether filter tap 50 should be shut down. With a k of 2, filter taps 48, 49, 51, and 52 are considered. Filter tap 50 is shut down only if the coefficient values of each filter tap 48 through 52 are below the threshold. If any of the coefficient values are above the threshold, filter tap 50 is kept on. If all the coefficient values for filter taps 48 through 52 are below the threshold, filter tap 50 is shut down. This analysis is performed for each of the 216 filter taps. Rather than using a blind threshold for shutdown, filter taps that are near filter taps with significant coefficient values are kept on. In this case, the definition of near is determined by the value of k. Larger values of k will result in more filter taps being kept on compared to smaller values of k. The examples herein produce lower current consumption while maintaining performance above an acceptable threshold, as described below.

For curve 302, filter taps located near filter taps 20 to 30 may be kept on, as those coefficient values are significant or are near other significant coefficient values. Likewise, filter taps located near filter taps 65 to 75 may be kept on according to examples herein. For the 15-meter cable represented by curve 304, filter taps located near filter taps 20 to 30 and near filter taps 65 to 75 may be kept on. Also, filter taps near filter taps 140 to 155 may be kept on as well for the 15-meter cable.

Figure 4:
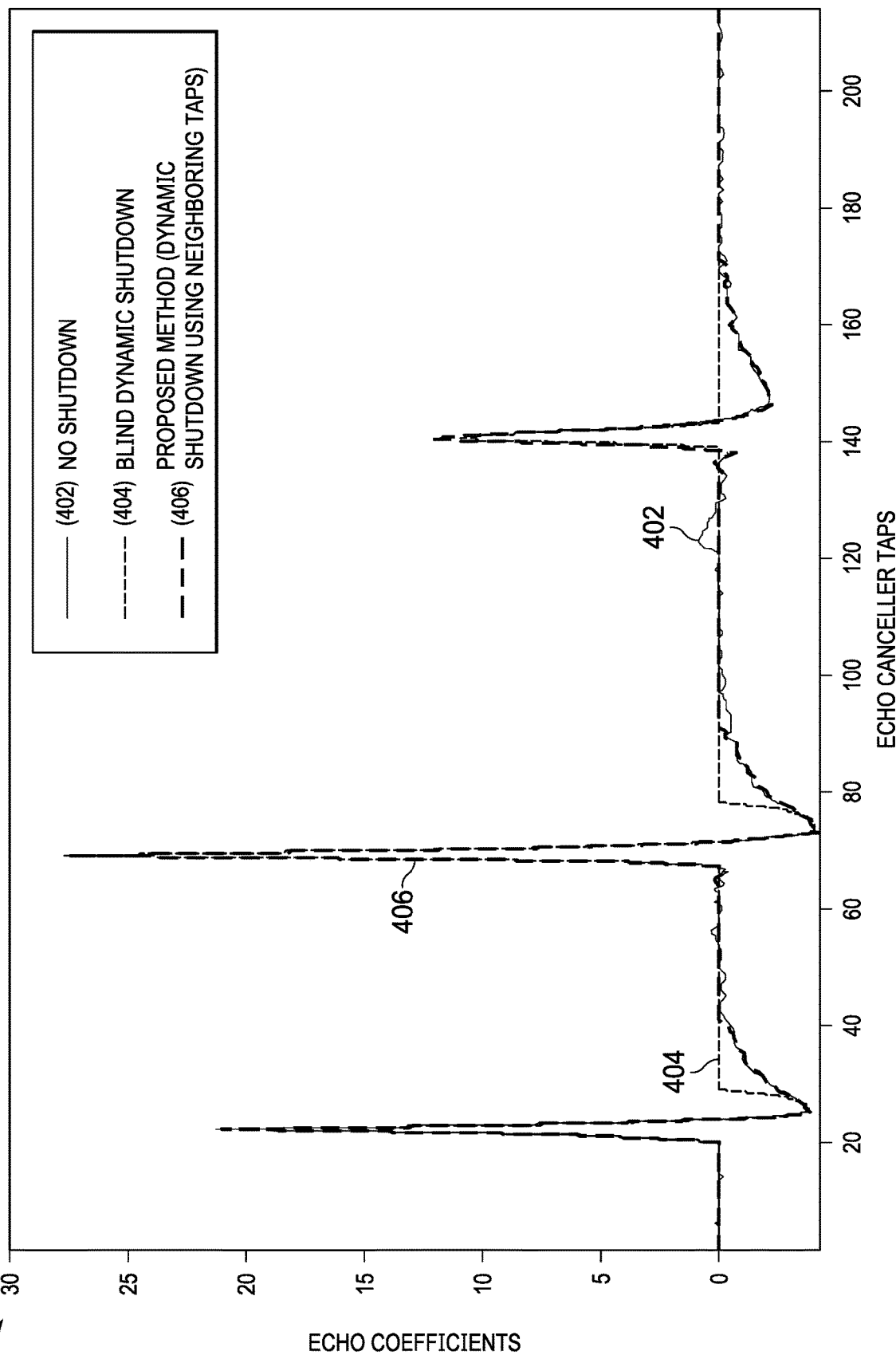
FIG. 4 is a graph of echo canceller taps and echo coefficients in accordance with various examples.

FIG. 4 is a graph 400 of echo canceller filter taps and echo coefficients in accordance with various examples. The x-axis indicates the number of the filter tap in the echo canceller, such as echo canceller 134. The y-axis indicates the value of the echo coefficient. A first curve 402 indicates the coefficients for the filter taps with no shutdown of filter taps.

A second curve 404 indicates a conventional system that uses blind dynamic shutdown. For the conventional system, filter taps with coefficient values below a certain threshold are shut down without consideration of any neighboring filter taps. On curve 404, filter taps between approximately 30 and 40 are shown with a coefficient value of zero, which means that these filter taps are shut down using the blind dynamic shutdown of the conventional system.

A third curve 406 indicates dynamic shutdown of filter taps using neighboring filter taps according to an example herein. With curve 406, filter taps are shutdown only if neighboring filter taps are also underneath a threshold for shutdown. As seen in curve 406, filter taps between approximately 30 and 40 are still on, whereas those filter taps are shut down using the blind dynamic shutdown represented by curve 404. Likewise, some filter taps between approximately 145 and 170 are kept on using the proposed method herein, where those filter taps would be shut down using the blind dynamic shutdown represented by curve 404. Therefore, in this example, shutting down filter taps by considering neighboring filter taps leads to more filter taps being kept on than the blind dynamic shutdown of the convention systems.

Figure 5:
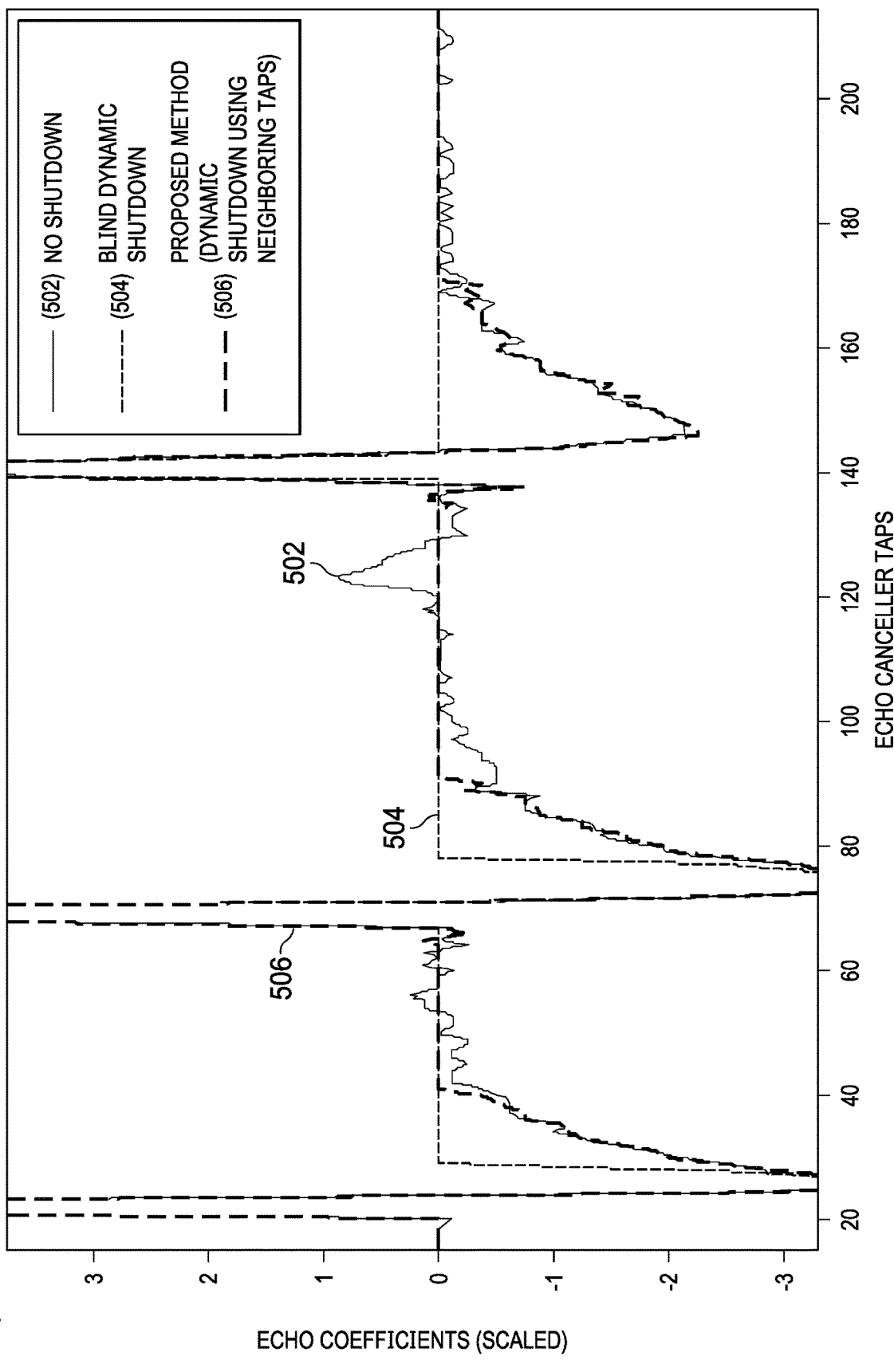
FIG. 5 is a graph of echo canceller taps and echo coefficients in accordance with various examples.

FIG. 5 is a graph 500 of echo canceller filter taps and echo coefficients in accordance with various examples. The x-axis indicates the number of the filter tap in the echo canceller, such as echo canceller 134. The y-axis indicates the value of the echo coefficient. The information in FIG. 5 is the same information conveyed in FIG. 4, but FIG. 5 has a scaled y-axis to better illustrate the differences between the three curves. A first curve 502 indicates the coefficients for the filter taps with no shutdown of filter taps. A second curve 504 indicates a conventional system that uses blind dynamic shutdown. A third curve 506 indicates dynamic shutdown of filter taps using neighboring taps according to an example herein. As seen with curve 502, no shutdown of filter taps leaves many filter taps on even though these filter taps have echo coefficient values that are small. With the blind shutdown of curve 504, many filter taps are shut down even though they have significant echo coefficient values. As seen with curve 506, the filter taps that are kept on more closely follow curve 502 than curve 504. More filter taps are kept on with curve 506 than curve 504. However, many filter taps that have insignificant values in curve 506 are shut down, and those filter taps are shown with an echo coefficient value of zero in curve 506.

Figures 6, 7:
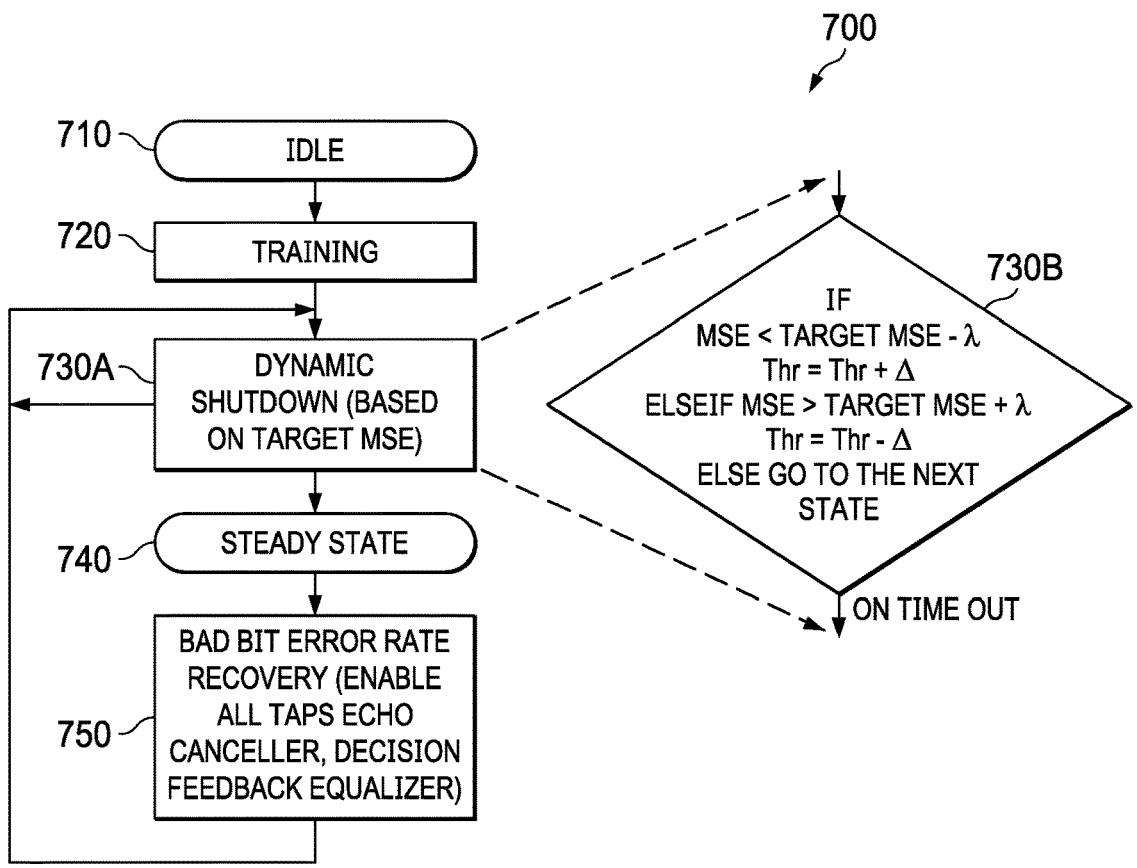
FIG. 6 is a table of performance results in accordance with various examples.
FIG. 7 is a flow diagram of a state machine that provides a signal-to-noise ratio (SNR) based iterative shutdown method in accordance with various examples.

FIG. 6 is a table 600 of performance results compared to conventional systems in accordance with various examples. The conventional approach using a blind shutdown is compared to the neighbor method according to examples herein. First, for a cable length of 6 meters, three echo coefficient thresholds are considered: no threshold (all filter taps kept on), a threshold of 1, and a threshold of 2. If all filter taps are kept on, the SNR is 25.1 decibels (dB). If the echo coefficient threshold is set to 1, the conventional blind shutdown approach results in 20 filter taps being kept on and an SNR of 24.9 dB. With a threshold of 1, the neighbor approach according to examples herein results in 26 filter taps being kept on and an SNR of 24.8 dB.

If the echo coefficient threshold is set to 2, the conventional blind shutdown approach results in 12 filter taps being kept on and an SNR of 22.9 dB. With a threshold of 2, the neighbor approach according to examples herein results in 14 filter taps being kept on and an SNR of 24.5 dB. With the neighbor approach, two more filter taps are kept on in this example, and the SNR is higher compared to the conventional approach.

Second, for a cable length of 15 meters (a 9-meter cable and a 6-meter cable), if all filter taps are kept on, the SNR is 22.9 dB. If the echo coefficient threshold is set to 1, the conventional blind shutdown approach results in 40 filter taps being kept on and an SNR of 22.3 dB. With a threshold of 1, the neighbor approach according to examples herein results in 50 filter taps being kept on and an SNR of 22.8 dB.

If the echo coefficient threshold is set to 2 for the 15-meter cable, the conventional blind shutdown approach results in 20 filter taps being kept on and an SNR of 20.1 dB. With a threshold of 2, the neighbor approach according to examples herein results in 26 filter taps being kept on and an SNR of 22.1 dB. With the neighbor approach, six more filter taps are kept on in this example, and the SNR is higher compared to the conventional approach.

FIG. 7 is a state machine 700 that provides an SNR-based iterative shutdown method in accordance with various examples. In some examples, one threshold for the echo coefficients that will be shut down is not optimal for all cable lengths, and may not be optimal for cables formed by multiple cable segments. The SNR at receiver 100 varies with cable length (e.g. SNR is higher for shorter cable lengths).

In accordance with various examples herein, the threshold may be fine-tuned based on a target MSE. The MSE is one measure of the performance of the system. A high MSE indicates that the error in the system is too high, and more filter taps should be kept on to reduce the error in future iterations. A low MSE indicates that the error in the system is low, and some additional filter taps may be turned off to reduce current consumption. Turning off additional filter taps may increase the MSE, but if the MSE is below an acceptable level, that tradeoff may be made to reduce current consumption until the MSE reaches a target level. State machine 700 may increase or decrease the threshold for shutdown of the echo coefficients in steps. This threshold is tuned until the target MSE is reached. At that point, the threshold is set and the system operates at steady state.

First, state 710 represents the idle state. State 720 is the training step. In state 730A, the dynamic shutdown threshold is determined based on a target MSE. The threshold is the echo coefficient level that is compared to the echo coefficients of the filter taps to determine if the filter taps are significant or not. The MSE is the inverse of the SNR (MSE=1/SNR). State 730B is an example of one approach for determining the threshold. First, a target MSE is set, along with a λ error value that represents an acceptable margin of error for the MSE. During training, the MSE of the system is determined (as shown above in FIG. 2). If the MSE is below the target MSE minus the λ error value, the threshold (Thr) is increased by a value of A. In other words, the MSE is below the target, and therefore the error in the system is better than expected in this example. Because the MSE is below the target, the threshold for echo coefficients may be increased so fewer filter taps are kept on during dynamic shutdown (e.g., only taps with higher echo coefficient values above the new threshold are kept on). Fewer filter taps remaining active will lead to a higher MSE, but as long as the MSE is still below the acceptable range, the tradeoff of fewer filter taps is made to reduce current consumption while still remaining within acceptable performance parameters.

On the other hand, if the MSE is above the target MSE plus the λ error value, the threshold (Thr) is decreased by a value of A. Decreasing the threshold value will activate some filter taps that are currently inactive, which will reduce the MSE in the system. In one example, as described above with respect to FIG. 6, a 6-meter cable with a threshold of 2 results in 14 filter taps being active using the neighbor method. Decreasing the threshold to 1 results in 26 filter taps being on. The extra 12 filter taps that are activated are the filter taps that have echo coefficients between 1 and 2 and that satisfy the neighbor method described herein (e.g., the neighbor values are also considered when determining whether to activate a filter tap). In this example, 12 additional taps are activated, which reduces the MSE in the system. The process in state 730B repeats until the MSE is within the acceptable range as determined by the λ error value. If the MSE is within the acceptable range, the state machine 700 proceeds to the steady state at state 740. In one example, a timeout may also be implemented. If the state 730B does not produce an MSE within the acceptable range in a given amount of time, state 730B may time out and proceed to state 740.

Also, the results may change during steady state 740 and fall below an acceptable range. For example, the MSE may be monitored and determined if it rises above an acceptable predetermined level (e.g., an MSE threshold). If this occurs, state machine 700 proceeds to state 750. State 750 is a recovery state that occurs responsive to a bit error rate (BER) or an MSE rising above an acceptable level. In the recovery state, all filter taps of the echo canceller 134 and DFE 144 are turned on. Then, the state machine proceeds to state 730A to perform the training process again as described above.

In some examples herein, the training time for the method described in FIG. 7 may take 30 to 45 milliseconds. However, in some applications the link-up time is 100 milliseconds, so the increased training time still occurs within an acceptable margin of time.

Figure 8:
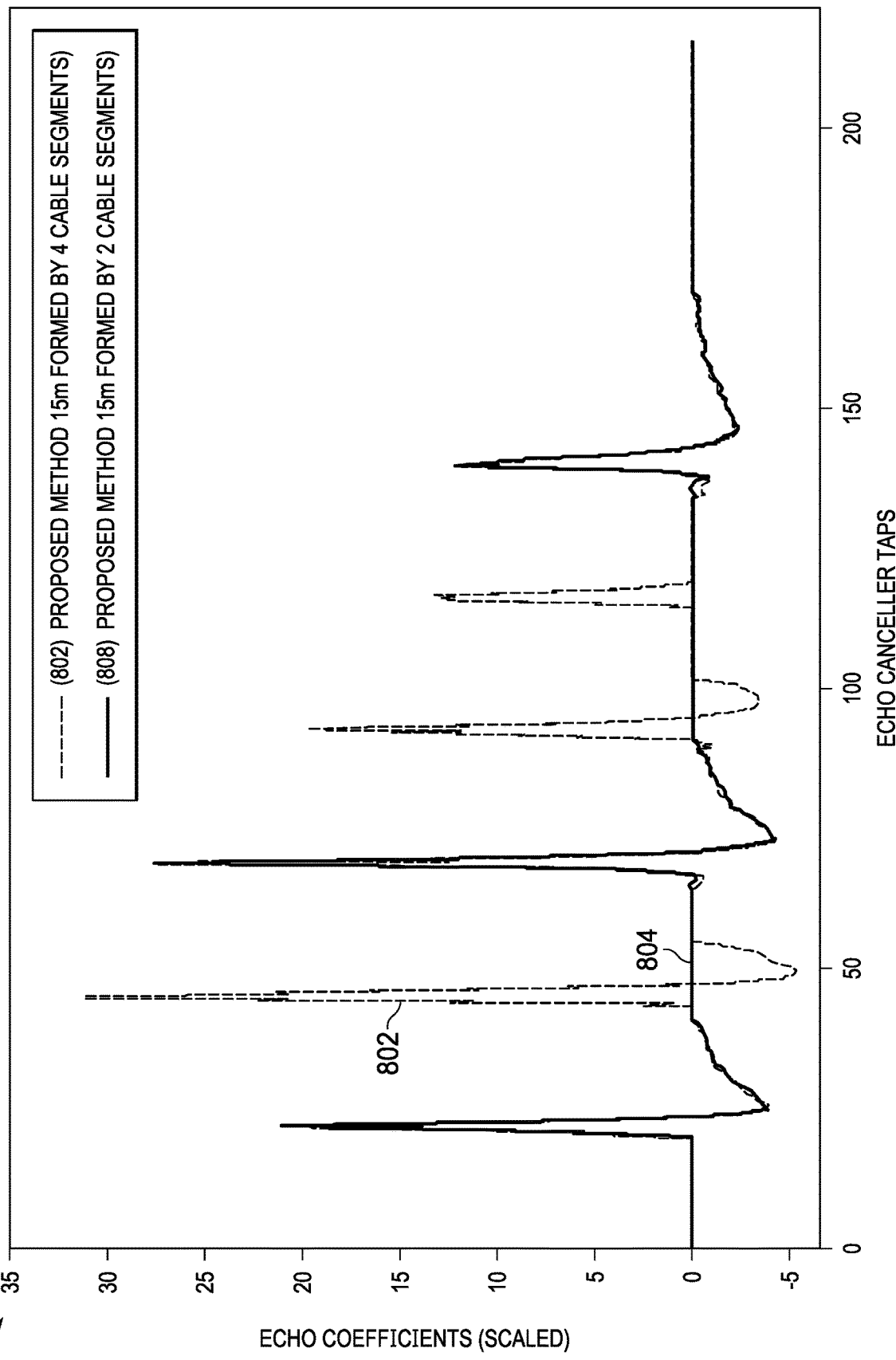
FIG. 8 is a graph of echo canceller taps and echo coefficients in accordance with various examples.

FIG. 8 is a graph 800 of echo canceller filter taps and echo coefficients in accordance with various examples. The x-axis indicates the number of the filter tap in the echo canceller, such as echo canceller 134. The y-axis indicates the value of the echo coefficient.

Curve 802 is a curve illustrating the neighboring filter tap shutdown method as described herein for a 15-meter cable formed by four cable segments. Curve 802 has peaks near filter tap 45, filter tap 90, and filter tap 120. Curve 804 is a curve illustrating the neighboring filter tap shutdown method as described herein for a 15-meter cable formed by two cable segments. The peaks of curve 804 are in different filter tap locations compared to the peaks in curve 802. For example, curve 804 has peaks near filter tap 20, filter tap 70, and filter tap 140.

Figure 9:
FIG. 9 is a table of performance results for shutting down filter taps using the neighbor method in accordance with various examples.

FIG. 9 is a table 900 of performance results for shutting down filter taps using the neighbor method in accordance with various examples herein. Various cable lengths are shown, with single cable lengths of one meter and six meters. Also shown in table 900 are 15-meter cable lengths composed of two cable segments and four cable segments, and a 21-meter cable length composed of four cable segments. In this example, the target SNR is 18 dB. That is, an SNR of 18 dB or greater is considered an acceptable performance threshold.

With a one-meter cable length, no shutdown of echo canceller filter taps provides an SNR of 26.2 dB, while shutting down echo canceller filter taps using the method proposed herein results in an SNR of 24.9 dB with only 8 active filter taps. Therefore, for a cable length of one meter, current consumption may be significantly reduced while still maintaining an SNR well above the target SNR of 18 dB. For a six-meter cable length, no shutdown provides an SNR of 25.3 dB. Shutting down echo canceller filter taps using the method proposed herein results in an SNR of 21.1 dB with only 8 active filter taps for the six-meter cable.

For the 15-meter cable composed of two cable segments, no shutdown provides an SNR of 22.9 dB. Shutting down echo canceller filter taps using the method proposed herein results in an SNR of 18.7 dB with 12 active filter taps for the 15-meter, two-segment cable.

For the 15-meter cable composed of four cable segments, no shutdown provides an SNR of 22.9 dB. Shutting down echo canceller filter taps using the method proposed herein results in an SNR of 18.2 dB with 40 active filter taps for the 15-meter, four-segment cable.

Finally, for the 21-meter cable composed of four cable segments, no shutdown provides an SNR of 20.3 dB. Shutting down echo canceller filter taps using the method proposed herein results in an SNR of 18.1 dB with 80 active filter taps for the 21-meter, four-segment cable.

Figure 10:
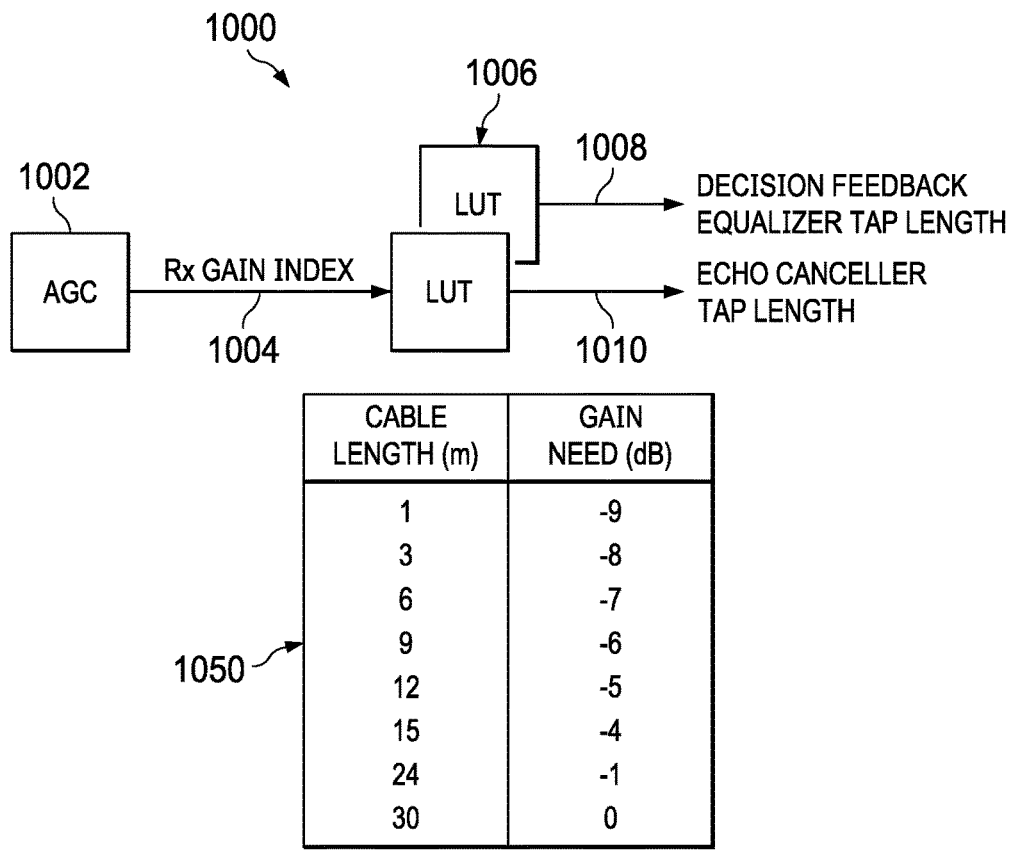
FIG. 10 is a diagram of a channel length-based shutdown method in accordance with various examples.

FIG. 10 is a diagram 1000 of a channel length-based shutdown method in accordance with various examples. In the dynamic shutdown methods described above, power is saved during steady state operation. During training, however, all filter taps are on and consuming power. If the cable length is known, some filter taps may be shut down during training as well. For example, for a one-meter cable, certain filter taps are not expected to be significant because there is no far end echo that has to be cancelled (see, e.g., the description of FIG. 3 above). A 15-meter cable length may use active filter taps to handle the far end echo, but those filter taps are not necessarily used for the one-meter cable. Therefore, certain filter taps may be turned off during training based on the cable length, to further reduce current consumption.

In one example, the receive gain (AGC) 1002 is useful to determine the filter tap length. In diagram 1000, AGC 1002 provides a receive gain index 1004 to a lookup table 1006. Based on the receive gain index 1004, the lookup table 1006 provides a DFE tap length 1008 and an echo canceller tap length 1010. The DFE tap length 1008 and echo canceller tap length 1010 indicate which filter taps may be turned off during training, based on the cable length. For shorter cable lengths, more filter taps may be turned off.

Table 1050 is an example of the receive gain that is used for different cable lengths. For small cable lengths, the signal is attenuated by some amount. For example, for a one-meter cable, the signal is attenuated by 9 dB. Therefore, the gain is an estimate of the channel length. The receiver gain is used in a lookup table to find the cable length, and from the cable length a determination is made that the filter taps beyond a certain tap value may be shut down. In one example, two lookup tables are used, one for the echo canceller filter taps and one for the DFE filter taps. Based on the receiver gain, the later filter taps may be shut down during training.

In another example, different cable types may have different lookup tables to determine which filter taps to shut down during training. For example, shielded and unshielded cables may have different insertion losses. Due to the different insertion losses, different amounts of gain may be useful for these different types of cables of the same length. However, whether the cable is shielded or unshielded, the same filter taps are kept on for a cable of a given length. Therefore, if one type of cable has more receiver gain than another type of cable of the same length, the lookup tables should reflect that the same number of filter taps should remain on for each cable type, even though the receiver gain is different.

Figure 11:
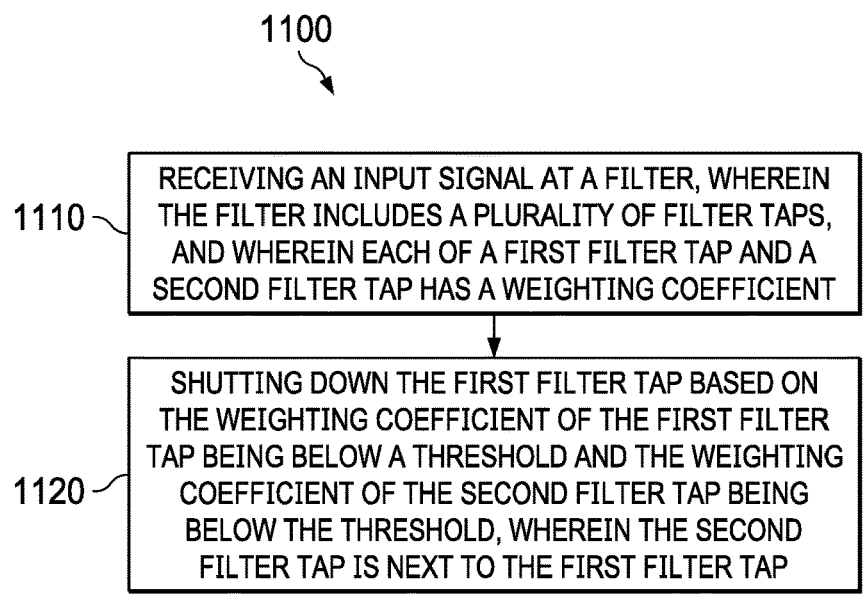
FIG. 11 is a flow diagram of a method for reducing power consumption in an Ethernet receiver in accordance with various examples.

FIG. 11 is a flow diagram of a method for reducing power consumption in an Ethernet receiver in accordance with various examples. The steps of method 1100 may be performed in any suitable order. The hardware components described above with respect to FIGS. 1 and 2 may perform method 1100 in one example.

Method 1100 begins at 1110, where a filter receives an input signal, where the filter includes a plurality of filter taps, and where each of a first filter tap and a second filter tap has a weighting coefficient. As described above in the description regarding FIG. 2, in one example a filter within echo canceller 134 receives an echo signal and filters the echo signal using filter taps with weighting coefficients.

Method 1100 continues at 1120, where the first filter tap is shut down based on the weighting coefficient of the first filter tap being below a threshold and the weighting coefficient of the second filter tap being below the threshold, where the second filter tap is next to the first filter tap. As described above, shutting down filter taps by considering whether neighboring filter taps are below a threshold produces acceptable results (such as acceptable SNR) while reducing current and power consumption.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value. Modifications are possible in the described examples, and other examples are possible within the scope of the claims.

What is claimed is:

1. A system, comprising:
a filter configured to receive an input signal, the filter having a first tap, a second tap and a third tap and each first tap, second tap and third tap has a weighting coefficient and a data gate; and
wherein the data gate is configured to shut down the first filter tap responsive to the weighting coefficients of the first filter tap, the second filter tap, and the third filter tap each being below a threshold, and wherein the second filter tap and the third filter tap are each next to the first filter tap;
wherein the data gate is configured to shut down the first filter tap responsive to the weighting coefficients of a fourth filter tap and a fifth filter tap each being below the threshold, wherein the fourth filter tap is next to the second filter tap, and the fifth filter tap is next to the third filter tap.

2. The system of claim 1, wherein the filter is within an echo canceller in an Ethernet receiver.

3. The system of claim 1, wherein the filter is within a decision feedback equalizer in an Ethernet receiver.

4. The system of claim 1, wherein the threshold is based at least in part on a signal to noise ratio of an Ethernet receiver.

5. The system of claim 1, wherein the threshold is based at least in part on a channel length of an Ethernet system.

6. The system of claim 1, wherein the data gate is configured to shut down the first filter tap by zeroing the weighting coefficient of the first filter tap.

7. A method, comprising:
   receiving an input signal at a filter, wherein the filter includes a plurality of filter taps, and wherein each of a first filter tap and a second filter tap has a weighting coefficient; and
   shutting down the first filter tap based on the weighting coefficient of the first filter tap being below a threshold, the weighting coefficient of the second filter tap being below the threshold and the weighting coefficient of a third filter tap adjacent to the first filter tap being below the threshold wherein the second filter tap and the third filter tap are next to the first filter tap.

8. The method of claim 7, further comprising:
   shutting down the first filter tap by clock gating the weighting coefficient of the first filter tap.

9. The method of claim 7, further comprising:
   shutting down the first filter tap by data gating the weighting coefficient of the first filter tap.

10. The method of claim 7, wherein the threshold is based at least in part on a signal to noise ratio of an Ethernet receiver.

11. The method of claim 7, wherein the threshold is based at least in part on a channel length of an Ethernet system.

12. The method of claim 7, wherein the filter is within an echo canceller in an Ethernet receiver.

\* \* \* \* \*